United States Patent
Truhitte

(10) Patent No.: US 11,037,903 B2
(45) Date of Patent: *Jun. 15, 2021

(54) PLASMA ETCH SINGULATED SEMICONDUCTOR PACKAGES AND RELATED METHODS

(71) Applicant: SEMICONDUCTOR COMPONENTS INDUSTRIES, LLC, Phoenix, AZ (US)

(72) Inventor: Darrell Truhitte, Phoenix, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 400 days.

This patent is subject to a terminal disclaimer.

(21) Appl. No.: 15/395,181

(22) Filed: Dec. 30, 2016

(65) Prior Publication Data

US 2017/0110436 A1    Apr. 20, 2017

Related U.S. Application Data

(63) Continuation of application No. 14/870,440, filed on Sep. 30, 2015, now Pat. No. 9,559,007.

(51) Int. Cl.
*H01L 21/00* (2006.01)
*H01L 23/00* (2006.01)
(Continued)

(52) U.S. Cl.
CPC ........ *H01L 24/96* (2013.01); *H01L 21/31138* (2013.01); *H01L 21/4821* (2013.01);
(Continued)

(58) Field of Classification Search
CPC ............... H01L 21/563; H01L 21/3043; H01L 23/3114; H01L 23/49811; H01L 23/3135; H01L 41/338
(Continued)

(56) References Cited

U.S. PATENT DOCUMENTS 6,465,344 B1 * 10/2002 Barton .................... H01L 21/78
257/E21.599
9,559,007 B1 * 1/2017 Truhitte .................. H01L 21/78
(Continued)

OTHER PUBLICATIONS

J. Tang, D. Gruber, J.B.J. Schelen, H.-J. Funke, and C.I.M. Beenakker, "Fast Etching of Molding Compound by an AR/O2/CF4 Plasma and Process Improvements for Semiconductor Package Decapsulation," published by ECS Journal of Solid State Science and Technology, published Aug. 24, 2012, p. 175-178.

*Primary Examiner* — Brook Kebede
(74) *Attorney, Agent, or Firm* — Adam R. Stephenson, Ltd.

(57) ABSTRACT

A method of forming a plurality of semiconductor packages includes providing an array of unsingulated semiconductor packages that are at least partially encapsulated in an encapsulant. The array of unsingulated semiconductor packages may be coupled with a lead frame or a substrate. A first plurality of singulation lines are simultaneously etched in the encapsulant through slits in an etch mask using a plasma etching process and a fixture coupled with the array. A second plurality of parallel singulation lines may also be etched. The first and second pluralities of singulation lines may include substantially straight or arcuate lines. The second plurality of parallel singulation lines may be substantially perpendicular to the first plurality of parallel singulation lines and be formed using the plasma etching process, the fixture, and an etch mask. The formation of singulation lines in the array singulates the array into a plurality of singulated semiconductor packages.

15 Claims, 6 Drawing Sheets

(51) Int. Cl.
*H01L 21/78* (2006.01)
*H01L 23/544* (2006.01)
*H01L 21/48* (2006.01)
*H01L 21/56* (2006.01)
*H01L 21/311* (2006.01)

(52) U.S. Cl.
CPC .......... *H01L 21/4853* (2013.01); *H01L 21/56* (2013.01); *H01L 21/78* (2013.01); *H01L 23/544* (2013.01); *H01L 21/4828* (2013.01); *H01L 21/561* (2013.01); *H01L 2223/54453* (2013.01)

(58) Field of Classification Search
USPC ................................. 438/113, 114; 257/737
See application file for complete search history.

(56) References Cited

U.S. PATENT DOCUMENTS

| | | | |
|---|---|---|---|
| 2009/0189279 A1* | 7/2009 | How | H01L 21/568 257/737 |
| 2015/0079281 A1* | 3/2015 | Choi | G03F 7/26 427/240 |
| 2016/0240452 A1* | 8/2016 | Prajuckamol | H01L 23/49811 |

* cited by examiner

PLASMA ETCH SINGULATED SEMICONDUCTOR PACKAGES AND RELATED METHODS

CROSS REFERENCE TO RELATED APPLICATIONS

This application is a continuation application of the earlier U.S. Utility Patent Application entitled "Plasma Etch Singulated Semiconductor Packages and Related Methods," application Ser. No. 14/870,440, filed Sep. 30, 2015, naming as first inventor Darrell Truhitte, the disclosure of which is hereby incorporated entirely herein by reference.

BACKGROUND

1. Technical Field

Aspects of this document relate generally to semiconductor packages. More specific implementations involve singulation of semiconductor packages from a lead frame or substrate containing a plurality of semiconductor packages.

2. Background Art

Semiconductor devices are used in a variety of devices in a variety of industries. Semiconductor devices are generally at least partially encapsulated or packaged in a material to protect elements of the device from wear, damage, moisture, and the like. During the fabrication of semiconductor devices there are often a plurality of devices that are formed within a single molded unit, and a singulation step such as sawing, laser cutting, or punching is generally utilized to separate individual semiconductor devices from one another.

SUMMARY

Implementations of methods of forming a plurality of semiconductor packages may include: providing an array of unsingulated semiconductor packages at least partially encapsulated in an encapsulant; simultaneously etching a first plurality of parallel singulation lines in the encapsulant using a plasma etching process and an etch mask and a fixture, and; simultaneously etching a second plurality of parallel singulation lines in the encapsulant using the plasma etching process and an etch mask and the fixture, thereby singulating the array to form a plurality of singulated semiconductor packages, the second plurality of parallel singulation lines being substantially perpendicular to the first plurality of parallel singulation lines.

Implementations of methods of forming a plurality of semiconductor packages may include one, all, or any of the following:

The plurality of singulated semiconductor packages may include leadless semiconductor packages.

The leadless semiconductor packages may include a quad flat no leads (QFN) package, a dual flat no leads (DFN) package, or a leadless land grid array (LLGA) package.

The plasma etching process may include etching with an Ar/O$_2$/CF$_4$ plasma.

The array of unsingulated semiconductor packages may be coupled with a lead frame or substrate.

Implementations of methods of forming a plurality of semiconductor packages may include: providing an array of unsingulated semiconductor packages coupled with a lead frame or substrate and at least partially encapsulated in an encapsulant; coupling an etch mask with the array, the etch mask having a plurality of slits therein, and; plasma etching a plurality of singulation lines in the array through the plurality of slits, thereby singulating the array to form a plurality of singulated semiconductor packages.

Implementations of methods of forming a plurality of semiconductor packages may include one, all, or any of the following:

The plurality of singulated semiconductor packages may include leadless semiconductor packages.

The leadless semiconductor packages may include a flat no leads package. The leadless semiconductor packages may include a quad flat no leads (QFN) package, a dual flat no leads (DFN) package, or a leadless land grid array (LLGA) package.

The plasma etching process may include etching with an Ar/O$_2$/CF$_4$ plasma.

The method may include coupling a second etch mask with the array and plasma etching a second plurality of singulation lines in the array through a plurality of slits in the second etch mask.

Each slit may be substantially formed of a substantially straight line.

Each slit may be substantially formed of a substantially arcuate line.

One or more of the singulated semiconductor packages may form an overall shape of a cylinder.

One or more of the singulated semiconductor packages may form an overall shape of a rectangular right cuboid.

One or more of the singulated semiconductor packages may form an overall shape of a triangular prism.

Implementations of methods of forming a plurality of semiconductor packages may include: providing an array of unsingulated semiconductor packages coupled with a lead frame or substrate and at least partially encapsulated in an encapsulant; coupling the lead frame or substrate with a fixture; coupling a first etch mask with the fixture, the first etch mask having a first pattern of slits; performing a first plasma etch process to form a first plurality of singulation lines in the array through the first pattern of slits, and; forming a second plurality of singulation lines in the array through a second pattern of slits using a second plasma etch process, thereby singulating the array to form a plurality of singulated semiconductor packages.

Implementations of methods of forming a plurality of semiconductor packages may include one, all, or any of the following:

The second pattern of slits may be included in the first etch mask and may be formed by rotating the first pattern of slits relative to the fixture.

The second pattern of slits may be included in a second etch mask.

The first and second plasma etch processes each may include etching with an Ar/O$_2$/CF$_4$ plasma.

The plurality of singulated semiconductor packages may include a flat no leads package. The plurality of singulated semiconductor packages may include a quad flat no leads (QFN) package, a dual flat no leads (DFN) package, or a leadless land grid array (LLGA) package.

The first plurality of singulation lines may be substantially parallel with respect to one another.

The second plurality of singulation lines may be substantially parallel with respect to one another and may be substantially perpendicular with respect to the first plurality of singulation lines.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended plasma etch singulated semiconductor packages and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such plasma etch singulated semiconductor packages and related methods, and implementing components and methods, consistent with the intended operation and methods.

Figure 1:
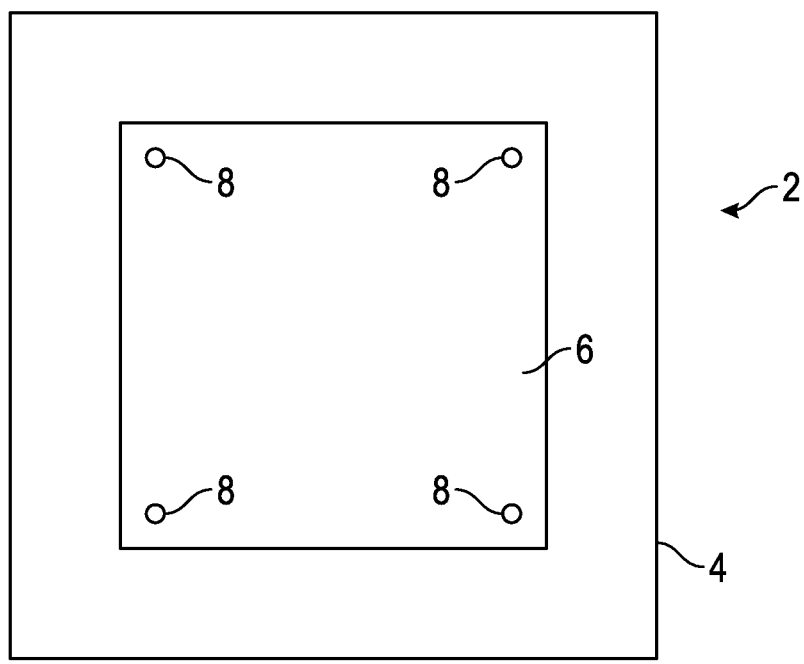
FIG. 1 is a top view of an implementation of a fixture used in a method of forming a plurality of semiconductor packages.
Figure 2:
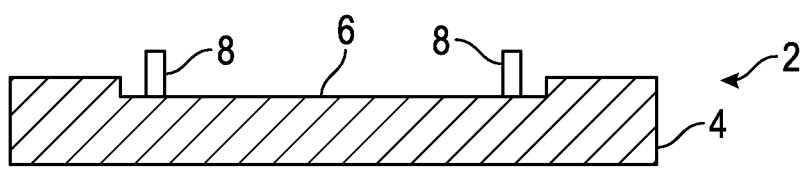
FIG. 2 is a side cross section view of the fixture of FIG. 1.

Referring now to FIG. 1, in implementations a fixture 2 is used in a method of forming a plurality of semiconductor packages. The fixture shown in FIGS. 1-2 includes a base 4 having a recess 6 therein, and extending upwards from the recess are a plurality of projections 8. In some implementations the recess could be optional. The fixture could be formed of a variety of materials including, by non-limiting example, metals, composites, polymers, ceramics, and the like.

Figure 3:
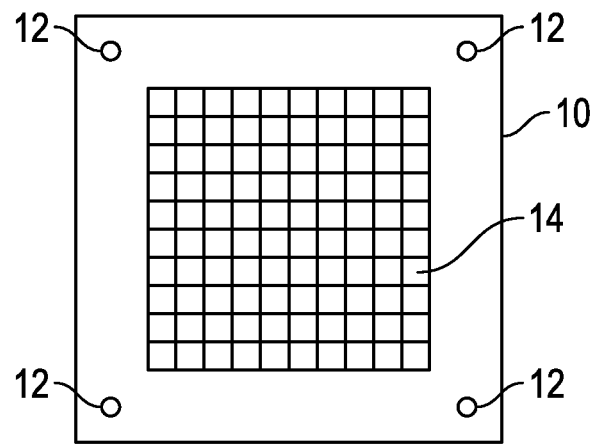
FIG. 3 is a top view of an implementation of a lead frame or substrate used in a method of forming a plurality of semiconductor packages.

A lead frame or substrate 10 is shown in FIG. 3. The lead frame or substrate includes a number of openings 12 that are configured to align with the projections 8 of the fixture. In other implementations this could be reversed—the lead frame or substrate could have projections and the fixture could have openings, or some other coupling mechanism (mechanical clips, screws, bolts or magnetic clips or other bonding) could be used to selectively couple the lead frame or substrate with the fixture. The lead frame or substrate includes an array 14 of electrical contacts and/or thermal pads/heat sinks and/or the like that will be exposed on an exterior of the singulated semiconductor packages once the packages are fully singulated to electrically and/or thermally couple elements interior to the package with elements of a printed circuit board (PCB) or the like during operation of the semiconductor package.

Figure 4:
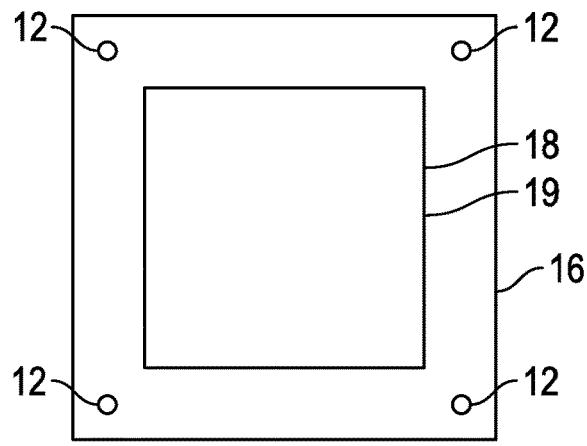
FIG. 4 is a top view of an implementation of a molded lead frame or substrate used in a method of forming a plurality of semiconductor packages.

FIG. 4 shows a molded lead frame or substrate 16 which includes the lead frame or substrate 10 and also includes an array 19 of unsingulated semiconductor packages at least partially encapsulated in an encapsulant 18. When the array 19 is singulated, each singulated semiconductor package will include a portion of the lead frame or substrate 10 as described above. The molded lead frame or substrate may include a molded array process or molded array package (MAP) configuration. Traditionally, processing times for MAP molded packages have been long, which has led to higher costs compared with cavity molded packages that are punch singulated. As described below, the process described herein using plasma etch singulation may reduce the cost of MAP molded packages.

Figure 5:
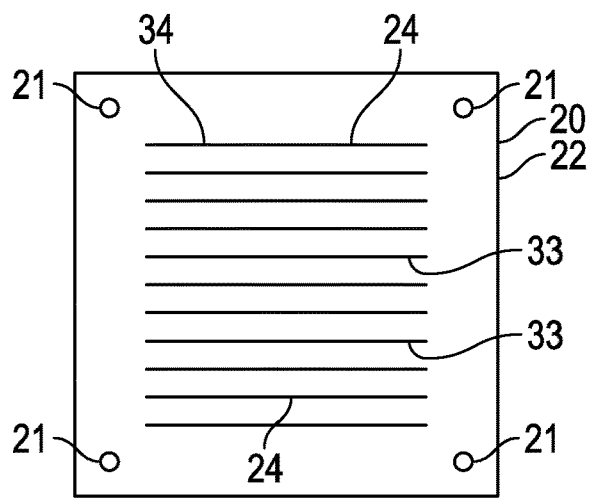
FIG. 5 is a top view of an implementation of a first etch mask used in a method of forming a plurality of semiconductor packages.
Figure 6:
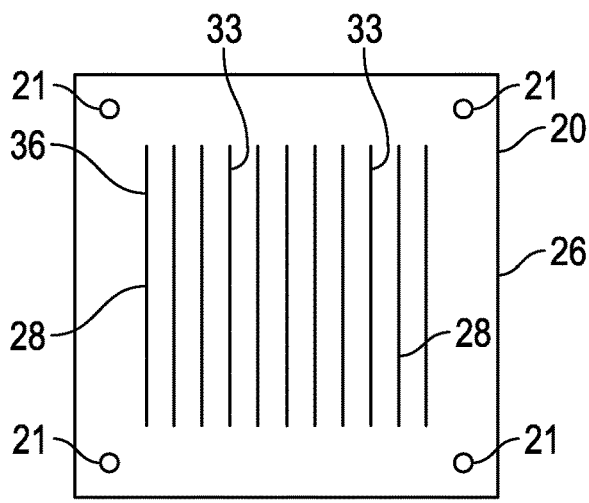
FIG. 6 is a top view of an implementation of a second etch mask used in a method of forming a plurality of semiconductor packages.

Etch masks 20 are shown in FIGS. 5 and 6. FIG. 5 shows a first etch mask 22 having a plurality of slits 24. The slits 24 are arranged in a first pattern 34 which includes a plurality of horizontal, parallel lines. The slits 28 of the second etch mask 26 are arranged in a second pattern 36 which includes a plurality of vertical, parallel lines. The slits 24 and 28 shown in the drawings are formed of substantially straight lines 33. The etch masks may be formed of a variety of materials, including metals, ceramics, and composites, so long as they are configured such that upon irradiation with a plasma the plasma does not pass through the etch mask except through the slits.

Figure 10:
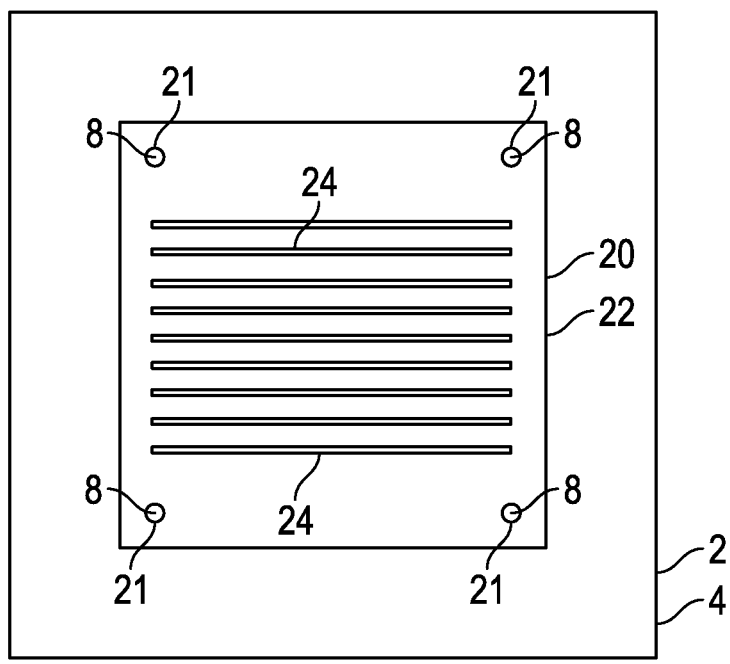
FIG. 10 is a top view of the elements of FIG. 8 with the first etch mask of FIG. 5 placed atop the molded lead frame or substrate.
Figure 11:
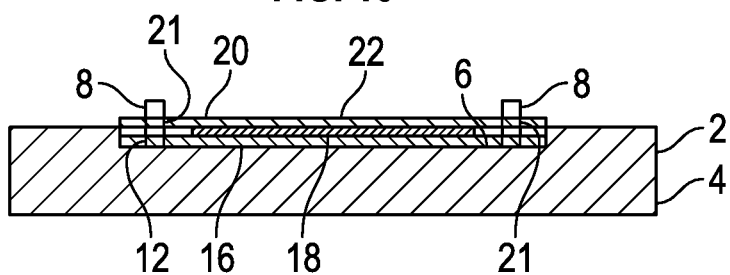
FIG. 11 is a side cross section view of the elements of FIG. 10.
Figure 13:
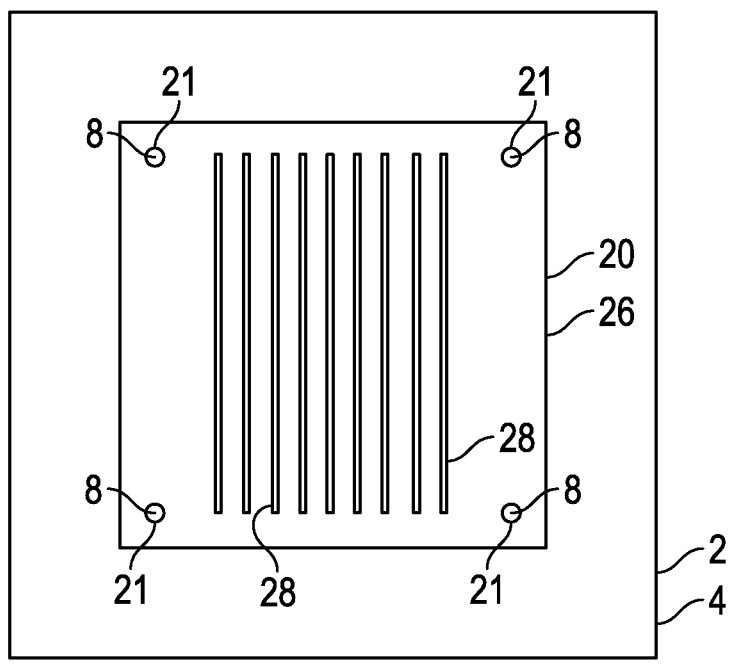
FIG. 13 is a top view of the molded, partially singulated lead frame or substrate of FIG. 12 coupled with the fixture of FIG. 1 and with the second etch mask of FIG. 6 placed atop the molded, partially singulated lead frame or substrate.
Figure 14:
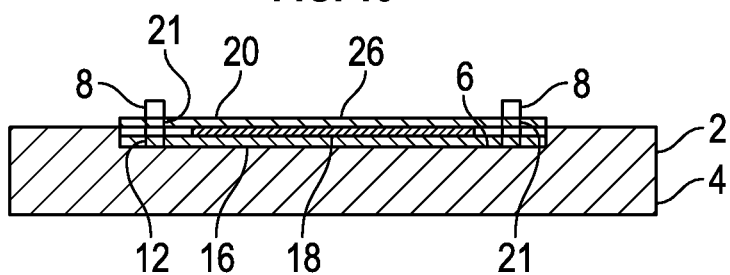
FIG. 14 is a side cross section view of the elements of FIG. 13.

The first etch mask and second etch mask each have openings 21 that align with the projections 8 of the fixture 2. FIGS. 10 and 11 show the molded lead frame or substrate and first etch mask coupled with the fixture and FIGS. 13 and 14 show the molded lead frame or substrate and second etch mask coupled with the fixture. The first etch mask and second etch mask may be different elements, though in implementations the second etch mask may simply be the first etch mask rotated 90 degrees from the position shown in FIG. 5 to achieve the position shown in FIG. 6.

Figure 7:
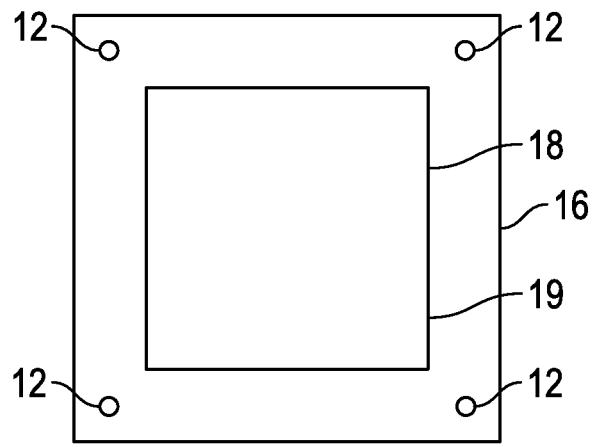
FIG. 7 is a top view of the molded lead frame or substrate of FIG. 4 prior to coupling the molded lead frame or substrate with the fixture of FIG. 1.
Figure 8:
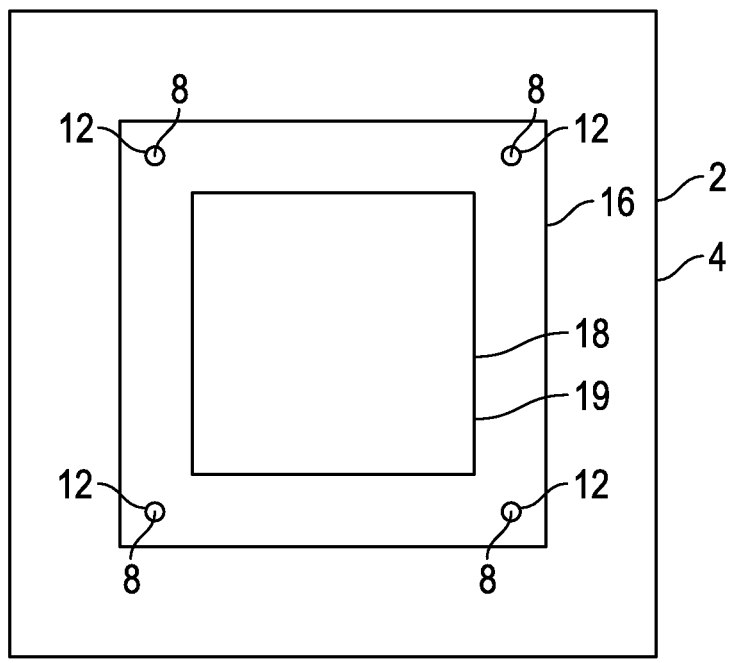
FIG. 8 is a top view of the molded lead frame or substrate of FIG. 4 coupled with the fixture of FIG. 1.
Figure 9:
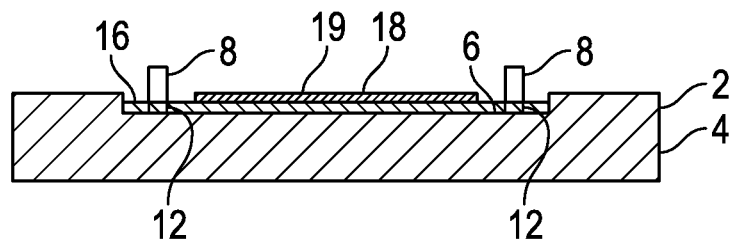
FIG. 9 is a side cross section view of the elements of FIG. 8.
Figure 12:
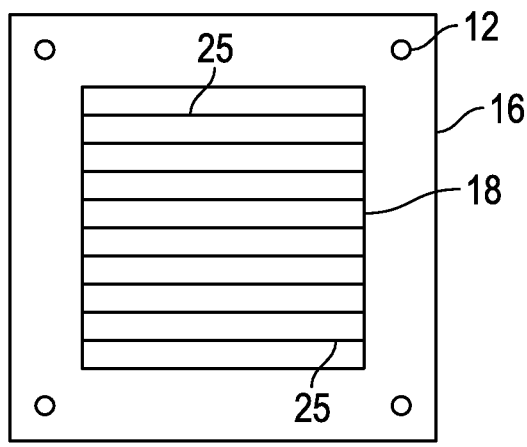
FIG. 12 is a top view of the molded lead frame or substrate of FIG. 11 after a plasma etch process has formed a plurality of horizontal singulation lines through the first etch mask.

FIG. 7 shows a top view of the molded lead frame or substrate and FIG. 8 shows a top view of the molded lead frame or substrate coupled with the fixture. FIG. 9 shows a side cross section view of the molded lead frame or substrate coupled with the fixture. When the first etch mask and molded lead frame or substrate are coupled with the fixture, as shown in FIG. 10, the assembly is configured to facilitate a first singulation step. FIG. 11 shows a side cross section view of the first etch mask, molded lead frame or substrate and fixture of FIG. 10. While in this configuration a plasma etching process may be utilized. A plasma, such as, by non-limiting example, an $Ar/O_2/CF_4$ plasma, may be struck above and ions/plasma components directed towards the top of the first etch mask. The first etch mask will prevent the plasma from reaching the encapsulant 18 except where the slits 24 are located. Accordingly, the plasma irradiation will result in singulation lines (trenches) 25 being formed in the encapsulant all the way through, thus partially singulating the array 19 into a plurality of horizontal strips, as shown in FIG. 12. Other plasmas may be used in some implementations instead of an $Ar/O_2/CF_4$ plasma, and a plasma may be chosen for its ability to effectively etch the encapsulant material and any other material through which the plasma will need to etch.

Figure 15:
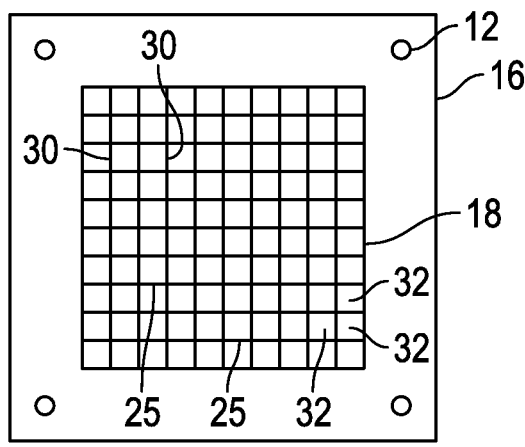
FIG. 15 is a top view of the molded lead frame or substrate of FIG. 12 after a plasma etch process has formed a plurality of vertical singulation lines through the second etch mask to form a plurality of fully singulated semiconductor packages.

After this process the first etch mask may be removed and replaced by the second etch mask. As described above, this could simply entail removing the first etch mask, rotating it 90 degrees, and replacing it, or it could entail removing the first etch mask and replacing it with a different etch mask. The second etch mask has a second pattern 36 of slits that are arranged substantially parallel to one another and substantially perpendicular to the singulation lines 25. Accordingly, when the second etch mask and molded lead frame or substrate 16 are coupled with the fixture, as shown in the top view of FIG. 13 and in the side cross section view of FIG. 14, the assembly is configured to facilitate the formation of singulation lines (trenches) 30 upon irradiation with the plasma, as shown in FIG. 15. The singulation lines 25 and 30 effectively singulate the array 19 into a plurality of singulated semiconductor packages (singulated packages) 32.

The lead frame or substrate, fixture and etch masks may be configured so that the singulated semiconductor packages are leadless semiconductor packages. The semiconductor packages may be flat no leads packages. The semiconductor packages may be quad flat no leads (QFN) packages, dual flat no leads (DFN) packages, or leadless land grid array (LLGA) packages.

While the exemplary etch masks described above include patterns of substantially parallel (or parallel) slits, any variety of slit configurations could be used during this plasma etching process to obtain a variety of semiconductor package shapes and configurations. Traditional singulation techniques include sawing, punching, laser, high pressure water jet (HPWJ), and the like. Traditional singulation techniques are used to form straight singulation lines one line (or street) at a time. This results in singulated semiconductor packages that have the shape of a cuboid (such as a right rectangular cuboid) and requires significant singulation time. With the singulation methods disclosed herein using plasma etching, a plurality of streets or singulation lines may be simultaneously etched quickly, thus reducing singulation time.

With the elements and processes disclosed herein singulation lines may be formed having any variety of shapes. The shape and configuration of the slits in the etch masks governs the shape and configuration of the singulation lines. A configuration of slits may be utilized to create the traditional semiconductor package shape, namely, that of a rectangular right cuboid. Additionally, various other shapes could be formed. By non-limiting example, a plurality of substantially arcuate slits in a first etch mask and a plurality of substantially arcuate slits in a second etch mask (or the first mask rotated at 180 degrees) could be used to form a plurality of substantially arcuate singulation lines that form circles. This would result in the formation of singulated semiconductor packages that have an overall cylindrical shape.

In other implementations the slits could be linear but could be oriented at angles other than 90 degrees from those of slits in other etch masks. For example three etch masks, having linear slits oriented from another at 60 degrees, could be utilized to form singulation lines that are in the form of an equilateral triangle, thus forming packages that have the overall shape of a triangular prism. Other configurations of slits could be utilized to form a right triangle (such as could be placed in a corner of a PCB. Other configurations could include L shapes, elongated narrow shapes, curved shapes, hexagon, octagon, any other polygonal shapes (such as any n-sided polygon), and any other regular or irregular shape as desired.

Figure 16:
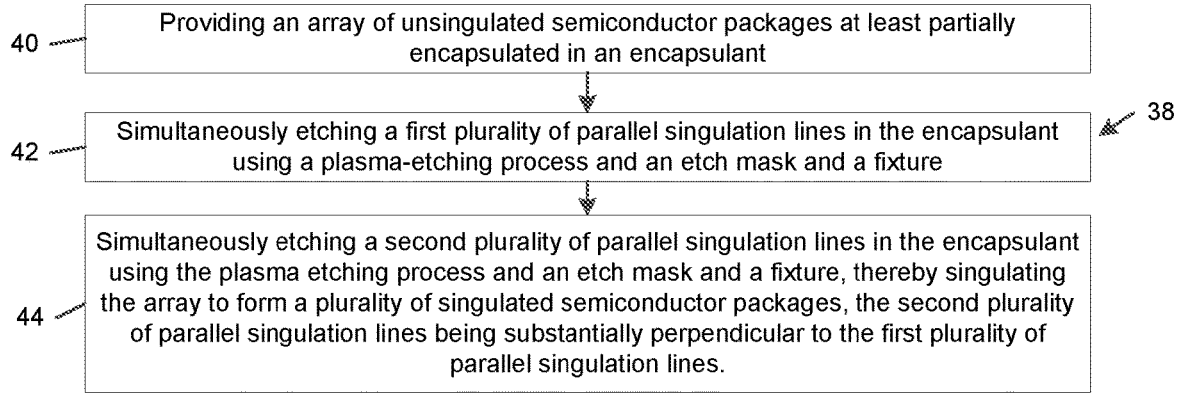
FIG. 16 is a flow chart of an implementation of a method of forming a plurality of semiconductor packages.

FIG. 16 shows a flowchart showing an implementation of a method 38 of forming a plurality of singulated semiconductor packages. An array of unsingulated semiconductor packages is provided, the unsingulated semiconductor packages at least partially encapsulated in an encapsulant (Step 40). A first plurality of parallel singulation lines are simultaneously etched in the encapsulant using a plasma etching process, an etch mask and a fixture (Step 42). A second plurality of parallel singulation lines are simultaneously etched in the encapsulant using the plasma etching process, an etch mask and the fixture, thereby singulating the array to form a plurality of singulated semiconductor packages, the second plurality of parallel singulation lines being substantially perpendicular to the first plurality of parallel singulation lines (Step 44).

Figure 17:
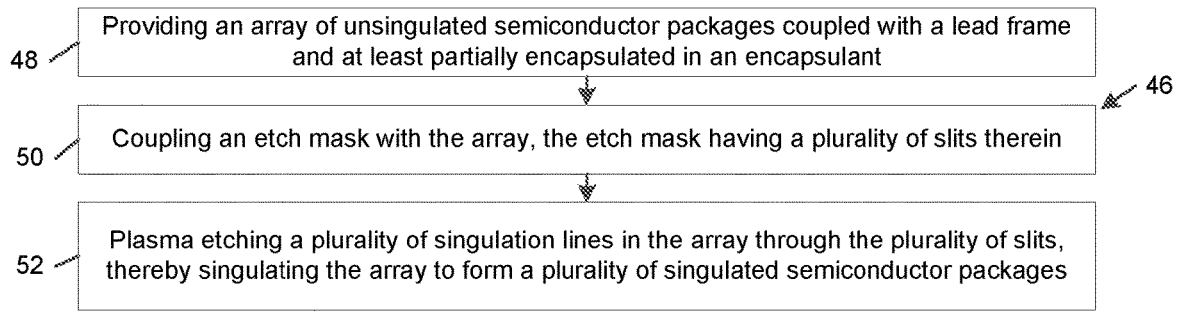
FIG. 17 is a flow chart of another implementation of a method of forming a plurality of semiconductor packages.

FIG. 17 shows a flowchart showing an implementation of a method 46 of forming a plurality of singulated semiconductor packages. An array of unsingulated semiconductor packages coupled with a lead frame or substrate are provided, the unsingulated semiconductor packages at least partially encapsulated in an encapsulant (Step 48). An etch mask is coupled with the array, the etch mask having a plurality of slits therein (Step 50). A plurality of singulation lines are plasma etched in the array through the plurality of slits, thereby singulating the array to form a plurality of singulated semiconductor packages (Step 52).

Figure 18:
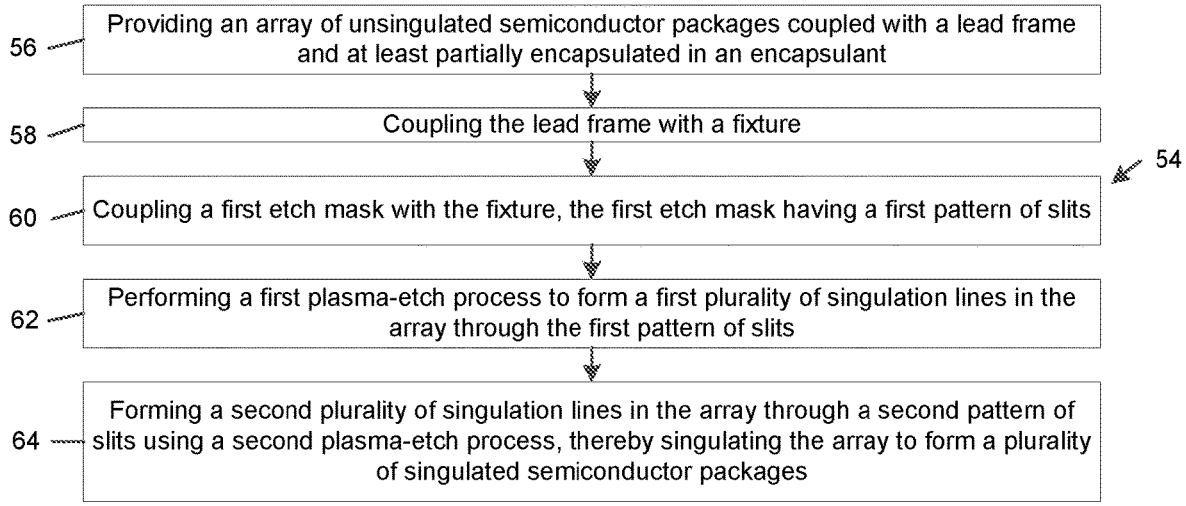
FIG. 18 is a flow chart of another implementation of a method of forming a plurality of semiconductor packages.

FIG. 18 shows a flowchart showing an implementation of a method 54 of forming a plurality of singulated semiconductor packages. An array of unsingulated semiconductor packages coupled with a lead frame or substrate is provided, the unsingulated semiconductor packages at least partially encapsulated in an encapsulant (Step 56). The lead frame or substrate is coupled with a fixture (Step 58). A first etch mask is coupled with the fixture, the first etch mask having a first pattern of slits (Step 60). A first plasma etch process is performed to form a first plurality of singulation lines in the array through the first pattern of slits (Step 62). A second plurality of singulation lines is formed in the array through a second pattern of slits using a second plasma etch process, thereby singulating the array to form a plurality of singulated semiconductor packages (Step 64).

$Ar/O_2/CF_4$ plasma etching has been used to de-encapsulate semiconductor packages by removing the encapsulant or molding compound, such as for failure analysis, as is described in J. Tang, D. Gruber, J. B. J. Schelen, H.-J. Funke, and C. I. M. Beenakker, "Fast Etching of Molding Compound by an $Ar/O_2/CF_4$ Plasma and Process Improvements for Semiconductor Package Decapsulation," *ECS Journal of Solid State Science and Technology*, 1 (4) P. 175-178 (2012) (herein "Tang, et al."), the entire disclosure of which is incorporated herein by reference. Any plasma etching techniques disclosed or described in Tang, et al. may also be utilized in any method for forming a plurality of semiconductor packages disclosed herein.

Being able to form singulated semiconductor packages that do not have sharp edges or corners (or that have rounded edges or corners) may result in less package cracking and chipping which may increase lifetime and reliability, thus improving quality. The ability to make any package shape may allow one to maximize the used space on a PCB, which may be especially useful for smaller PCBs. Additionally, the plasma etching process is relatively quicker than traditional singulation techniques, which can result in higher throughput. Higher lead frame or substrate density may be achieved because plasma etched trenches can be narrower than traditional saw streets. It is also expected that the plasma etching singulation process will result in improved profit margins and less capital investment to expand capacity as compared with traditional singulation techniques.

Some current dual flat no leads (DFN) packages have package thicknesses ranging from 0.25 mm to 1.0 mm (including 0.25 mm, 0.30 mm, 0.40 mm, 0.50 mm, 0.55 mm, 0.80 mm, and 1.0 mm). Approximate etch rates for the plasma etching described herein is 140 microns per minute. This etching rate may be accomplished by tailoring the $CF_4$ ratio in the $O_2/CF_4$ etchant gas. In implementations the peak etching rate may occur at a $CF_4$ ratio of about 45%. This may result in the following etching times for various DFN package thicknesses: 1.00 mm=7.2 minutes; 0.80 mm=5.7 minutes; 0.55 mm=3.9 minutes; 0.50 mm=3.6 minutes; 0.40 mm=2.9 minutes; 0.30 mm=2.1 minutes; 0.25 mm=1.8 minutes. These are the times for one pass (for instance, if two etch masks are used for both vertical and horizontal singulation lines, the overall etch time would be doubled because two passes are required).

The methods disclosed herein may be more easily implemented when using lead frame or substrates that do not include half-etch tie bars between packages (and thus wherein the plasma etch process does not need to etch through half-etch tie bars). Nevertheless, the plasma etching process disclosed herein could be modified and/or used in conjunction with other etching or singulation techniques for singulating packages wherein half-etch tie bars are present between packages.

The methods disclosed herein may be utilized with wafer level processing wherein an entire wafer is processed/singulated (such as wafer level flat no leads (WLFN) packaging). In particular implementations, a coating or other etch masking material could be applied above one or more of the packages in a wafer level or other set of unsingulated semiconductor packages. The application could be through spin coating, spray coating, or other coating techniques. In these implementations, instead of using an etching fixture with one or more etch masks, the etch masking material applied to the one or more packages defines the areas where the plasma is able to etch away the encapsulant and singulate the one or more packages. In various implementations, combinations of coating/etch mask materials and the etching fixtures and etch masks disclosed herein may be used to accomplish the desired singulation.

In places where the description above refers to particular implementations of plasma etch singulated semiconductor packages and related methods and implementing components, subcomponents, methods and submethods, it should be readily apparent that a number of modifications may be made without departing from the spirit thereof and that these implementations, implementing components, subcomponents, methods and submethods may be applied to other plasma etch singulated semiconductor packages and related methods.

What is claimed is:

1. A method of forming a plurality of semiconductor packages, comprising:
    providing an array of unsingulated semiconductor packages coupled with one of a lead frame and a substrate and at least partially encapsulated in an encapsulant;
    coating an etch mask on the array, the etch mask having a plurality of slits therein; and
    plasma etching a plurality of singulation lines in the array through the plurality of slits, thereby singulating the array to form a plurality of singulated semiconductor packages.

2. The method of claim 1, wherein the plurality of singulated semiconductor packages comprises leadless semiconductor packages.

3. The method of claim 2, wherein the leadless semiconductor packages comprise one of a quad flat no leads (QFN) package, a dual flat no leads (DFN) package, and a leadless land grid array (LLGA) package.

4. The method of claim 1, wherein the plasma etching comprises etching with an $Ar/O_2/CF_4$ plasma.

5. The method of claim 1, wherein the etch mask is coated on the array using one of a spin coating technique and a spray coating technique.

6. The method of claim 1, wherein each slit is substantially comprised of a substantially straight line.

7. The method of claim 1, wherein each slit is substantially comprised of a substantially arcuate line.

8. The method of claim 1, wherein one or more of the singulated semiconductor packages comprises an overall shape of a cylinder.

9. The method of claim 1, wherein one or more of the singulated semiconductor packages comprises an overall shape of a rectangular right cuboid.

10. The method of claim 1, wherein one or more of the singulated semiconductor packages comprises an overall shape of a triangular prism.

11. A method of forming a plurality of semiconductor packages, comprising:
    providing an array of unsingulated semiconductor packages in an encapsulant;
    etching a first plurality of singulation lines in the encapsulant using a plasma etching process and an etch mask and a fixture;
    etching a second plurality of singulation lines in the encapsulant using the plasma etching process and an etch mask and the fixture; and
    etching a third plurality of singulation lines in the encapsulant using the plasma etching process and an etch mask and the fixture, thereby singulating the array to form a plurality of singulated semiconductor packages.

12. The method of claim 11, wherein the plurality of singulated semiconductor packages comprises leadless semiconductor packages.

13. The method of claim 12, wherein the leadless semiconductor packages comprise one of a quad flat no leads (QFN) package, a dual flat no leads (DFN) package, and a leadless land grid array (LGA) package.

14. The method of claim 11, wherein the plasma etching process comprises etching with an $Ar/O_2/CF_4$ plasma.

15. The method of claim 11, wherein the array of unsingulated semiconductor packages are coupled with one of a lead frame and a substrate.

* * * * *